(12) United States Patent
Lemoff et al.

(10) Patent No.: US 10,474,230 B2
(45) Date of Patent: Nov. 12, 2019

(54) BRIGHTNESS CONTROL FOR AN AUGMENTED REALITY EYE-MOUNTED DISPLAY

(71) Applicant: Spy Eye, LLC, Los Gatos, CA (US)

(72) Inventors: Brian Elliot Lemoff, Morgan Hill, CA (US); Michael West Wiemer, San Jose, CA (US); Paul Scott Martin, Palo Alto, CA (US); Hansong Zhang, Los Altos, CA (US); Drew Daniel Perkins, Saratoga, CA (US)

(73) Assignee: Tectus Corporation, Saratoga, CA (US)

( * ) Notice: Subject to any disclaimer, the term of this patent is extended or adjusted under 35 U.S.C. 154(b) by 0 days.

(21) Appl. No.: 15/838,834

(22) Filed: Dec. 12, 2017

(65) Prior Publication Data

US 2018/0173304 A1     Jun. 21, 2018

Related U.S. Application Data

(60) Provisional application No. 62/435,039, filed on Dec. 15, 2016.

(51) Int. Cl.
*G09G 5/00*     (2006.01)
*G06F 3/01*     (2006.01)
(Continued)

(52) U.S. Cl.
CPC .............. *G06F 3/013* (2013.01); *G02C 7/04* (2013.01); *G03B 21/00* (2013.01); *G03B 21/14* (2013.01);
(Continued)

(58) Field of Classification Search
CPC ......... G06F 3/013; G03B 21/00; G03B 21/14; G03B 2213/025; G03B 21/2053;
(Continued)

(56) References Cited

U.S. PATENT DOCUMENTS 6,851,805 B2    2/2005  Blum et al.
8,786,675 B2    7/2014  Deering
(Continued)

OTHER PUBLICATIONS

PCT International Search Report and Written Opinion, PCT Application No. PCT/US2017/065999, dated Feb. 15, 2018, 13 pages.
(Continued)

*Primary Examiner* — Kent W Chang
*Assistant Examiner* — Andrew Lee
(74) *Attorney, Agent, or Firm* — Fenwick & West LLP (57) ABSTRACT

A system controls a brightness of an augmented reality (AR) eye-mounted device. The system includes an eye-mounted display, a photodetector system, and a controller. The eye-mounted display includes a contact lens and a femtoprojector. The femtoprojector is contained in the contact lens and is configured to project an AR image to a user's retina. The AR image is overlaid on an external scene viewed by the user through the contact lens. The photodetector system detects a brightness level of the external scene. Based on the brightness level of the external scene, the controller adjusts a brightness level of the AR image projected to the user's retina. In some embodiments, the eye-mounted display receives image data defining the AR image and the controller adjusts a bit depth of the image data based on the brightness level of the AR image.

20 Claims, 10 Drawing Sheets
(3 of 10 Drawing Sheet(s) Filed in Color)

(51) Int. Cl.
  *G02C 7/04* (2006.01)
  *G06G 3/10* (2006.01)
  *H01L 31/02* (2006.01)
  *G03B 21/00* (2006.01)
  *G03B 21/14* (2006.01)
  *H01L 31/101* (2006.01)
  *G03B 21/20* (2006.01)

(52) U.S. Cl.
  CPC ......... *G06G 3/10* (2013.01); *H01L 31/02024* (2013.01); *H01L 31/101* (2013.01); *G03B 21/2053* (2013.01); *G03B 2213/025* (2013.01); *G09G 2320/0626* (2013.01)

(58) Field of Classification Search
  CPC ...... G02C 7/04; G06G 3/10; H01L 31/02024; G09G 2320/0626
  See application file for complete search history.

(56) References Cited

U.S. PATENT DOCUMENTS

| | | |
|---|---|---|
| 9,251,745 B2 | 2/2016 | Sprague |
| 9,335,562 B2 | 5/2016 | Pugh et al. |
| 9,366,881 B2 | 6/2016 | Pugh et al. |
| 2012/0242678 A1 | 9/2012 | Border et al. |
| 2012/0326948 A1* | 12/2012 | Crocco .................... G09G 5/00 345/7 |
| 2013/0113973 A1 | 5/2013 | Miao |
| 2015/0049004 A1 | 2/2015 | Deering et al. |
| 2015/0097853 A1 | 4/2015 | Bastani et al. |
| 2015/0160475 A1 | 6/2015 | Yang et al. |
| 2015/0169047 A1* | 6/2015 | Reponen ................. G06F 3/013 345/156 |
| 2015/0312560 A1* | 10/2015 | Deering ............. G02B 13/0085 345/1.3 |
| 2016/0170097 A1 | 6/2016 | Milton et al. |
| 2016/0299354 A1* | 10/2016 | Shtukater ................. G02C 7/04 |
| 2016/0320179 A1* | 11/2016 | Balzano ............. G01B 11/272 |
| 2016/0364914 A1* | 12/2016 | Todeschini ............ G06T 19/006 |
| 2017/0039958 A1* | 2/2017 | Ghosh .................... G09G 5/003 |

OTHER PUBLICATIONS

U.S. Appl. No. 62/415,376, filed Oct. 31, 2016, Inventors Miller et al.

* cited by examiner

BRIGHTNESS CONTROL FOR AN AUGMENTED REALITY EYE-MOUNTED DISPLAY

CROSS-REFERENCE TO RELATED APPLICATION(S)

This application claims priority under 35 U.S.C. § 119(e) to U.S. Provisional Patent Application Ser. No. 62/435,039, "Contact Lens Display Auto-Brightness," filed on Dec. 15, 2016. The subject matter of all of the foregoing is incorporated herein by reference in their entirety.

BACKGROUND

1. Technical Field

This disclosure relates generally to an eye-mounted display and, more particularly, to controlling brightness of the eye-mounted display.

2. Description of Related Art

Eye-mounted devices can be used for augmented reality (AR) applications. In AR applications, the images projected by the eye-mounted device augment what the user would normally see as his external environment. For example, they may appear as overlays on the external environment. If the AR image is not bright enough, it may be difficult to see. However, if the AR image is too bright, it may be uncomfortable to view.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

A system adjusts the brightness of AR images projected by an eye-mounted display relative to the incoming ambient light to provide a comfortable viewing experience. In some embodiments, the eye-mounted display is based on tiny projector(s), each one no larger than about one or two millimeters in any dimension, mounted inside a contact lens. See, e.g. U.S. Pat. No. 8,786,675, "Systems using eye mounted displays" by Deering, which is incorporated by reference herein. Deering called these small projectors "femtoprojectors" where "femto" is a suggestive, rather than literal, prefix. The femtoprojector in the contact lens projects an image to the user's retina. If the eye-mounted display is partially transparent, then the image from the femtoprojector is combined with the external scene viewed by the user though the contact lens, thus creating an augmented reality. The AR image from the femtoprojector is overlaid on the image of the external scene.

The system also includes a photodetector that detects a brightness level of the external scene, and a controller that adjusts a relative brightness level of the AR image and the external scene. In some embodiments, a photodetector with a wider field of view detects an ambient brightness level of the external scene as a whole, such as a peak brightness level or an average brightness level of the entire external scene. Alternatively, a photodetector with a narrower field of view can detect a brightness level of a local sensing area that includes only a portion of the external scene, for example the portion over which the AR image is overlaid. In some embodiments, the photodetector can be oriented to sense different local sensing areas in the external scene.

In some designs, the photodetector is mounted in the contact lens and moves with the user's eye. The femtoprojector, which is also mounted in the contact lens, also moves with the user's eye. Thus, the photodetector automatically maintains the same orientation relative to the user's field of view and relative to the femtoprojector, even as the user looks in different directions. For example, if the photodetector is aligned to the user's gaze direction, then the photodirector will detect an ambient brightness level of wherever the user is looking. If the photodetector has a wider field of view, it will detect a more average brightness level. If the photodetector has a narrower field of view, it will detect a more specific brightness level. If the user is looking from one object to another, a narrow field of view photodetector may detect the brightness of the one object and then of the other object.

As another example, the photodetector may be aligned to the location to which the AR image is projected. In that case, the photodetector detects the brightness level of the external scene on which the AR image is overlaid.

Based on the brightness level of the external scene detected by the photodetector, the controller determines a brightness level for the AR image. Preferably, the controller controls the femtoprojector so that the AR image is at least two times brighter than the corresponding external scene (when both are projected onto the retina). In one approach, the controller adjusts a bit depth of image data defining the AR image. For example, with a high level of brightness of the external scene, the controller can reduce a bit depth of the image data. Benefits of reducing the bit depth of the image data include saving power and bandwidth in transferring the image data to the eye-mounted display.

In some embodiments, the system also includes a dimmer layer positioned between the external scene and the user's retina (e.g., in or on the contact lens). The controller adjusts a transparency of the dimmer layer to adjust a brightness level of the external scene at the user's retina.

Figure 1:
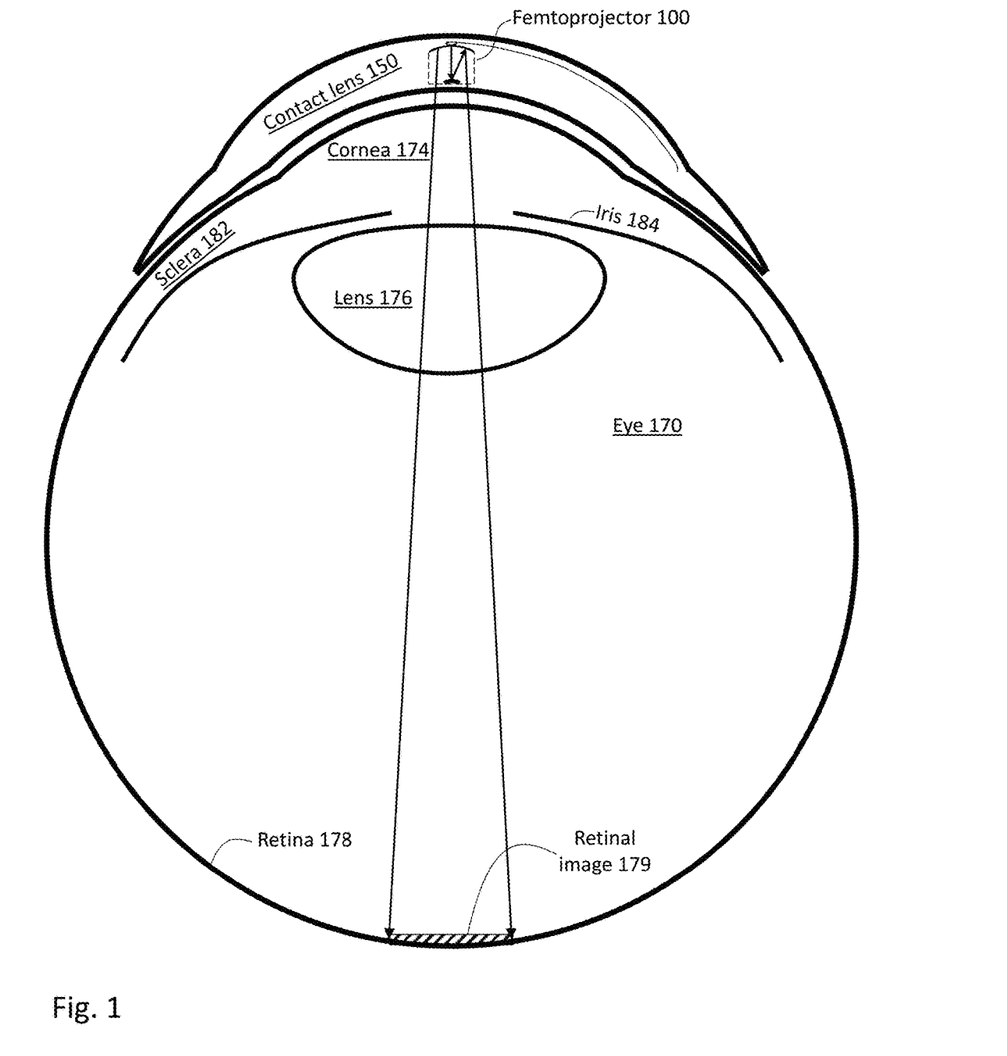
FIG. 1 shows a cross sectional view of an eye-mounted display containing a femtoprojector in a contact lens.

FIG. 1 shows a cross sectional view of an eye-mounted display containing a femtoprojector 100 in a contact lens

150. FIG. 1 shows an embodiment using a scleral contact lens. In the embodiment of FIG. 1, the scleral contact lens is designed to not move relative to the cornea. The contact lens 150 is separated from the cornea 174 of the user's eye 170 by a tear layer. Over the cornea 174, the tear layer may be as thick as a hundred microns or more while it may be only a few microns thick over the sclera 182. In an alternative embodiment, the contact lens 150 does not have to be scleral.

The contact lens 150 preferably has a thickness that is less than two mm, and the femtoprojector 100 preferably fits in a 2 mm by 2 mm by 2 mm volume. The contact lens 150 is comfortable to wear and maintains eye health by permitting oxygen to reach the cornea 174. The optical path from the image source in the femtoprojector 100 to the image 179 on the retina 178 may or may not include air gaps, depending on other design considerations. More details about the femtoprojector are described in conjunction with FIG. 3.

Figure 2:
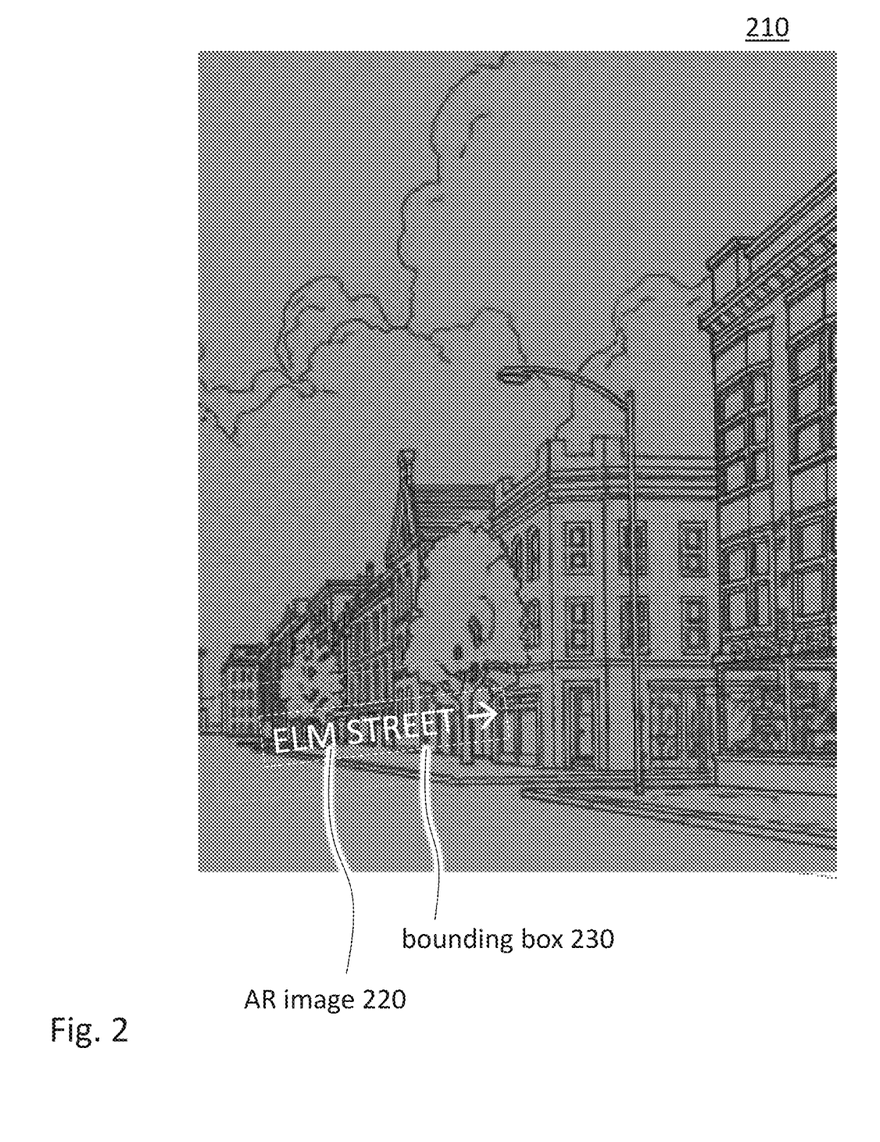
FIG. 2 shows an AR image projected by an eye-mounted display and overlaid on an external scene.

FIG. 2 shows an AR image 220 projected by an eye-mounted display and overlaid on an external scene 210. The external scene 210 shown in FIG. 2 is a view seen by a user walking or driving down a street. The eye-mounted display, such as the eye-mounted display described in FIG. 1, is worn by the user and projects the AR image 220 to the user's retina. Consequently, the user has a view of the AR image 220 overlaid on the external scene 210, creating an augmented reality.

The AR image 220 is a notification "ELM STREET→" showing a name of a side street in the external scene 210. In FIG. 2, the notification is shown as white text. In actual application, light from the projected text 220 is combined with light from the background scene 210. In order to be visible, the text 220 must be sufficiently bright to be visible over the background scene 210. On the one hand, if the brightness of the AR image 220 is too high, the user can have uncomfortable viewing of the AR image 220. On the other hand, if the brightness of the AR image 220 is too low, it will be difficult for the user to view the AR image 220 against the external scene 210.

In one embodiment, a brightness of the AR image 220 is about two to four times brighter than a brightness of the external scene 210. Both the external scene 210 and the AR image 220 can include objects/features with different levels of brightness. Clouds in the external scene 210, for example, may be brighter than shadows in an alleyway. Similarly, the arrow symbol in the AR image 220 may be presented with a higher brightness or different color than the notification, for example. Thus, a determination of a brightness of the AR image 220 may be based on various measures of brightness of the external scene 210, such as a peak ambient brightness of the entire external scene 210, an average ambient brightness of the entire external scene 210, and/or a peak or average brightness of just a portion of the external scene 210. Likewise, the system can adjust different brightnesses for the AR image, such as a peak or average brightness, and a brightness of the entire AR image 220 or of just a portion of the AR image.

In FIG. 2, a brightness level of only a portion of the external scene 210 is used to determine a brightness of the AR image 220. The AR image 220 can be bounded by a rectangular bounding box, indicated by the dashed box 230. The AR image 220 is overlaid on the external scene within the bounding box 230. Hence, the brightness level within this bounding box 230 is used to determine the brightness of the AR image 220. In this example, the text and arrow of the AR image 220 all have the same brightness, which is adjusted to be N times the brightness of the region in the bounding box 230.

In FIG. 2, the bounding box 230 is centered on the AR image 220. Alternatively, the portion of the external scene 210 used to determine brightness of the AR image 220 may coincide with the center of the user's field of view. That way, the brightness of the AR image 220 can be dynamically adjusted based on a brightness that is at the center of the user's attention. For example, the brightness of the AR image 220 is increased as the user looks up at clouds and decreased as the user looks into the dark alleyway. In some embodiments, the AR image 220 may be dimmed when the user is not looking directly at it.

AR images are not opaque like actual objects, but they can be made to appear opaque if they are sufficiently brighter than the external scenes over which they are overlaid. Conversely, AR images presented at lower brightness levels may be made to appear translucent. In embodiments where a user uses an eye-mounted display for a specific task, a particular external scene may be provided to the user to improve appearance of an AR image projected by the eye-mounted display. For example, the external scene may have a black, light absorbing area. The user can look at the area when it is important to see a high dynamic range of brightness levels (i.e., high bit depth) in an AR image.

Figure 3:
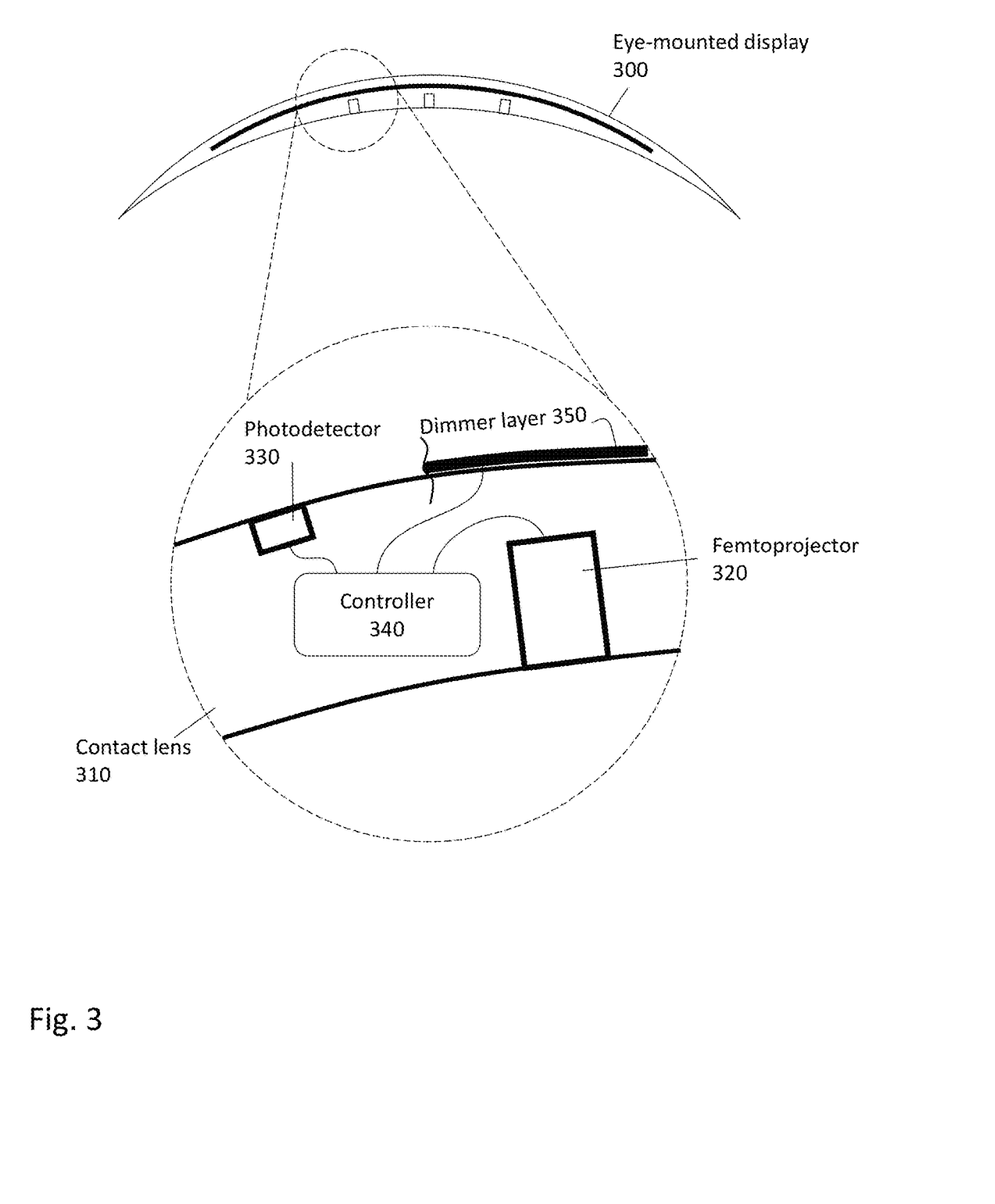
FIG. 3 shows a cross sectional view of a contact lens containing a femtoprojector, a photodetector, a controller, and a dimmer layer.

FIG. 3 shows a cross sectional view of a contact lens 310 containing a femtoprojector 320, a photodetector 330, a controller 340, and a dimmer layer 350. The contact lens 310 and the femtoprojector 320 are components of an eye-mounted display 300. The photodetector 330, controller 340, and dimmer layer 350 are used to control a relative brightness of the eye-mounted display 300 and, in FIG. 3, they are also shown as mounted on/in the contact lens 310. However, in alternate embodiments, these functions may be performed by components mounted in a necklace or headpiece communicating with the eye-mounted display 300. An example design of the contact lens 310 is the contact lens 150 as described in conjunction with FIG. 1.

The femtoprojector 320 projects an AR image to a user's retina. An implementation of the femtoprojector 320 includes driver circuitry, an LED (light emitting diode) array and projection optics. In one approach, the driver circuitry and LED array are manufactured separately and later bonded together to form electrical connections. Alternately, they can be integrated on a single common substrate.

The driver circuitry receives image data defining the AR image from a system (e.g., an external image source) communicating with the eye-mounted display 300. For example, the image source can be mounted on a device worn by the user. The drive circuitry of the femtoprojector 320 converts the image data to drive signals to drive the LED array (e.g., drive currents for LEDs). To save power, the driver circuitry and LED array may power down when no image data are received.

The LED array contains an array of LEDs that produce light according to the drive signals from the driver circuitry, thus generating the AR image corresponding to the image data received by the femtoprojector 320. The array of light emitters can have different geometries. One example geometry is a rectangular array of LEDs. Another example geometry is a hexagonal array of LEDs. The light from the LEDs is projected by an optical system to a portion of the retina that spans a certain field of view. Thus, the LEDs form a visual sensation of the AR image at the user's retina. The AR image is configured to be overlaid with an external scene viewed by a user through the contact lens 310.

The photodetector 330 detects a brightness level of the external scene. It may be a single sensor (with or without directional optics) or it may be an image sensor that captures an image of the external scene. It may have a narrower or wider field of view, depending on design considerations. The system may further include analog-to-digital converters (not shown), so that the output signals are digital rather than analog.

As shown in FIG. 3, the photodetector 330 is located near an outer surface of the contact lens 310 so that the photodetector 330 can detect light from the external scene. However, other designs of the photodetector 330 may be mounted at other depths of the contact lens 310. It may also be mounted outside the contact lens 310.

In some embodiments, the photodetector 330 detects the brightness level of the external scene in accordance with instructions from the controller 340. Also, the photodetector 330 outputs signals to the controller 340 and the controller 340 determines the brightness level of the external scene based on the signals. In embodiments where the output signals are analog, the controller 340 may be implemented as analog electronics. Likewise, in embodiments where the output signals are digital, the controller 340 can be implemented as digital electronics.

In some embodiments, the controller 340 controls the photodetector 330 to detect a brightness level of a local sensing area within the external scene, as opposed to an ambient brightness of the entire external scene viewed by the user. In some embodiments, the local sensing area includes a portion of the external scene over which the AR image is overlaid. Alternatively, the local sensing area includes an area at which the user is looking. Because the photodetector 330 is mounted in the contact lens 310, it moves with the user's eye and therefore can be oriented to the area at which the user is looking.

In some other designs, the controller 340 controls the photodetector 330 to detect an ambient brightness of the entire external scene. For example, the photodetector 330 captures ambient light of the entire external scene and outputs signals to the controller 340 for determining an average brightness of the captured ambient light.

As another example, the controller 340 uses the photodetector 330 to sample the brightness of the external scene spatially or at different points, e.g., by using a multielement photodetector. For each sample location, the photodetector 330 detects a brightness level and the controller 340 combines these sample measurements to determine a brightness measure for the scene. The combination may be based on an average or weighted average of the samples.

The controller 340 adjusts a brightness level of the AR image projected by the femtoprojector 310 to the user's retina based on the brightness level of the external scene. In some instances, the controller 340 adjusts the brightness level of the AR image at the retina to a brightness level that is at least two times of the brightness level of the external scene. Because the AR image is at least two times brighter than the portion of the external scene at the retina, the user can see the AR image on top of the external scene. The controller 340 may adjust the brightness level of the AR image at the retina to a brightness level that is less than four times the brightness level of the external scene, to avoid uncomfortable viewing of the AR image by the user. In some embodiments, if the external scene is dark, the controller 340 may adjust the brightness level of the AR image at the retina to a minimum brightness level, which may be more than four times the brightness level of the external scene.

In some instances, the controller 340 can adjust the brightness level of the AR image to achieve a transparent effect of the AR image. Thus, the user can see both the AR image and the portion of the external scene over which the AR image is overlaid.

The controller 340 can also adjust the brightness level of the AR image based on the availability of power in the eye-mounted display 300. For example, in response to signals indicating that available power is beyond a threshold amount, the controller 340 may increase the brightness level of the AR image. In response to signals indicating that available power is below the threshold amount, the controller 340 may reduce the brightness level of the AR image to reduce power consumption of the eye-mounted display 300.

The controller 340 can also instruct a power source external to the contact lens 310 to supply more or less power to the eye-mounted display 300. For example, when the femtoprojector 310 projects an AR images at a brightness level less than a full brightness level, the controller 340 instructs the power source to supply less than full power to the contact lens display to save power stored in the power source. Alternatively, the controller 340 can cause excess power to be stored in the contact lens 310 in a battery, supercapacitor or other energy storage device (not shown in FIG. 3).

Not only the brightness of the AR image can be adjusted, a brightness of the external scene at the user's retina can also be adjusted. The design shown in FIG. 3 uses the dimmer layer 350 to adjust a brightness level of the external scene at the user's retina. The dimmer layer 350 is positioned between the external scene and the retina. Thus, the user views the external scene through the dimmer layer 350. The controller 340 adjusts a transparency of the dimmer layer 350, thereby adjusting the brightness level of the external scene at the retina. The controller 340 can change the transparency of the dimmer layer 350 from fully transparent to partially transparent to fully opaque. Many different levels of partial transparency may be selected by the controller 340. The controller 340 can adjust transparency of the dimmer layer 350 to save power. By reducing the brightness of the external scene at the retina, the controller 340 can also decrease the brightness of the AR image, which saves power.

The dimmer layer 350 can be positioned in or on the contact lens. For example, the dimmer layer is formed inside the outer surface of the contact lens 310. In an example design, the dimmer layer 350 is a liquid crystal layer. The dimmer layer 350 may be covered by a silicone hydrogel. In the embodiment of FIG. 3, the dimmer layer 350 covers all of the outer surface of the contact lens 310. Alternatively, the dimmer layer 350 may cover a part of the outer surface. For example, the dimmer layer 350 extends to a maximum extent of a fully dilated pupil. The dimmer layer 350 may also be patterned to avoid covering the photodetector 330 so that ambient light from the external scene can reach the photodetector 330. In some embodiments, the dimmer may function as an artificial iris where light is passed in the center but blocked at the periphery, or the pupil may be dimmed uniformly, or dimming may be performed in any desired pattern.

In the embodiment of FIG. 3, the photodetector 330 and the controller 340 are contained in the contact lens 310. In other embodiments, they can be located outside the contact lens 310. For example, the photodetector 330 or the controller 340 is contained in an external device that communicates with the eye-mounted display 300. For example, the controller 340 wirelessly communicates the brightness level of the AR image to the eye-mounted display 300. The driving circuitry of the femtoprojector 320 receives the brightness level and drives the LED array accordingly. Alternately, the controller 340 adjusts the brightness level of the image data sent to the eye-mounted display. The external device can be worn by the user. More details about such an external device are described in conjunction with FIG. 7 and FIG. 8.

Figure 4:
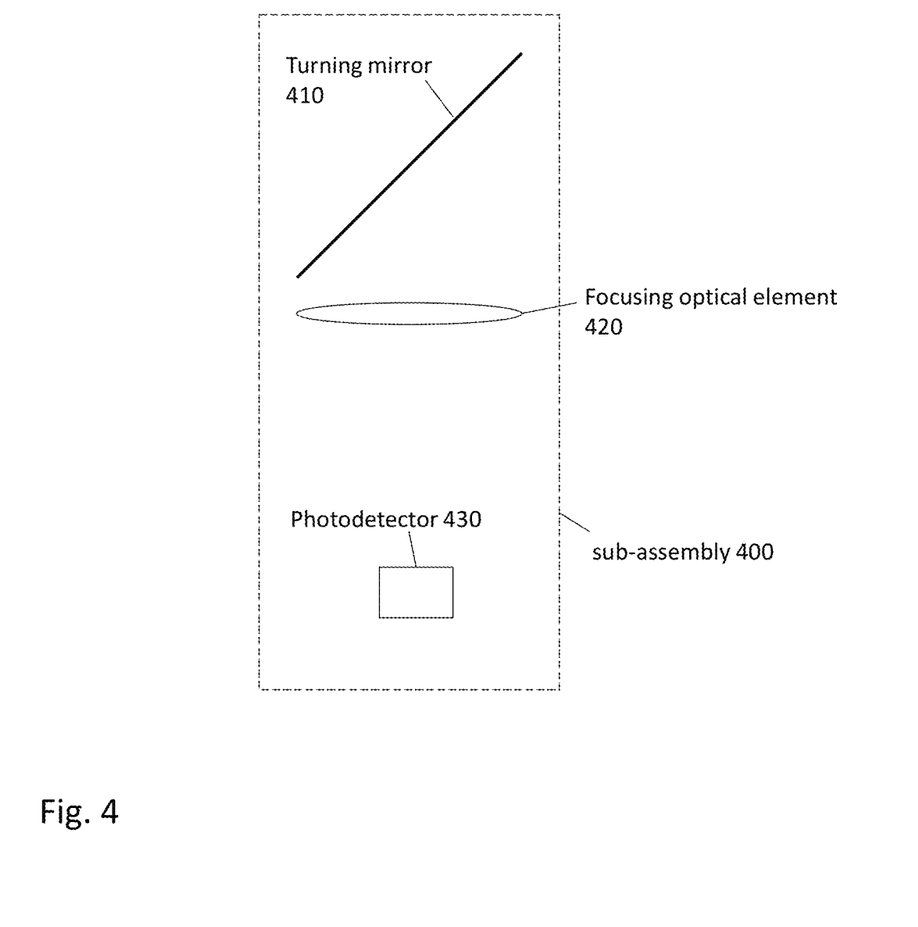
FIG. 4 is a schematic diagram of a photodetector subassembly.

FIG. 4 is a schematic diagram of a sub-assembly 400 with a steerable photodetector 430. It includes a turning mirror 410, a focusing optical element 420, and the photodetector 430. The focusing optical element 420 narrows the field of view of the photodetector 430. The turning mirror 410 is tiltable and allows the controller to orient the photodetector 430 to different locations in the external scene. The sub-assembly 400 can include other types of steering optical elements, such as deformable diffractive elements (e.g., linear arrays of micro-electromechanical ribbons). The mirror 410 also turns the optical path by 90 degrees, so that the optical path is not limited by the thickness of the contact lens.

Figure 5A:
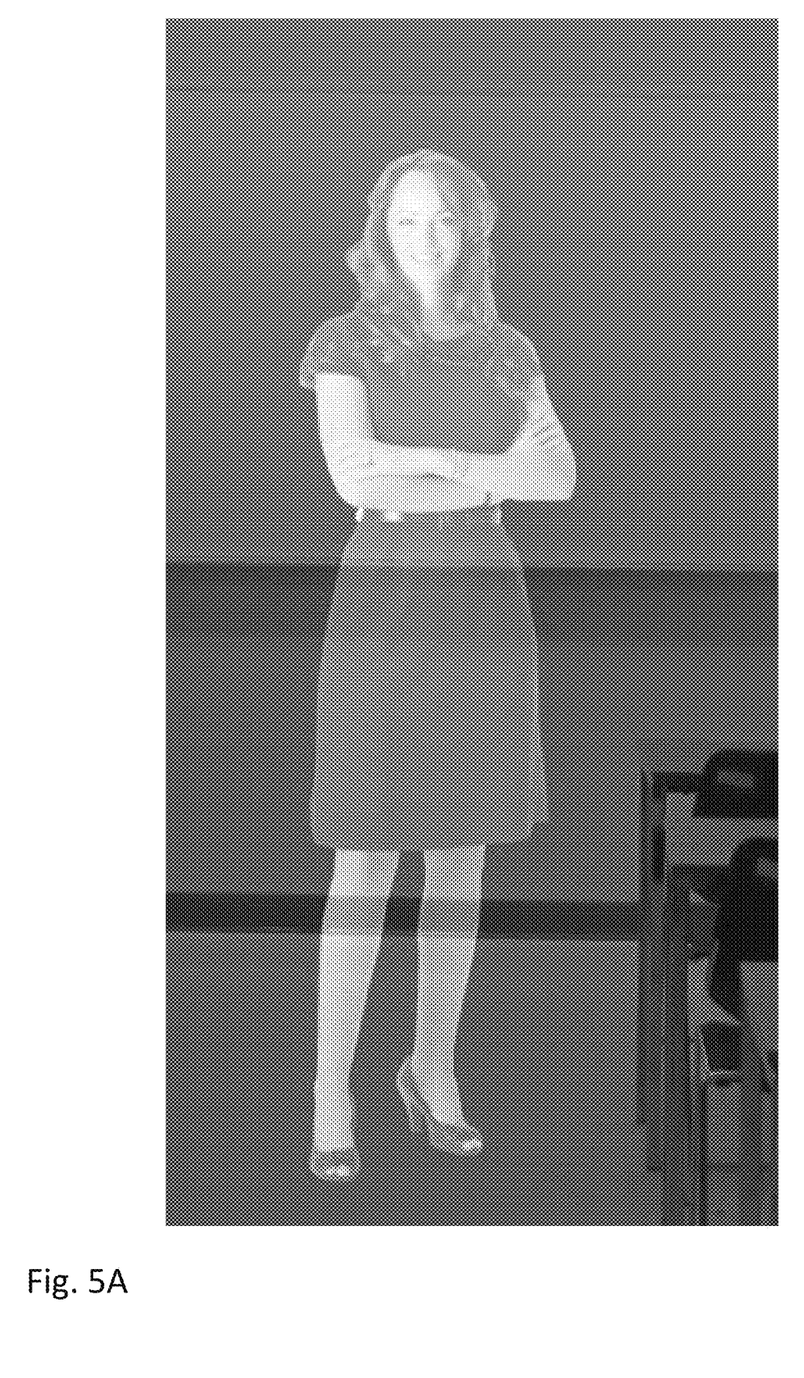
FIGS. 5A-5C illustrate adjusting a bit depth of the AR image based on a brightness level of the external scene.
Figure 5B:
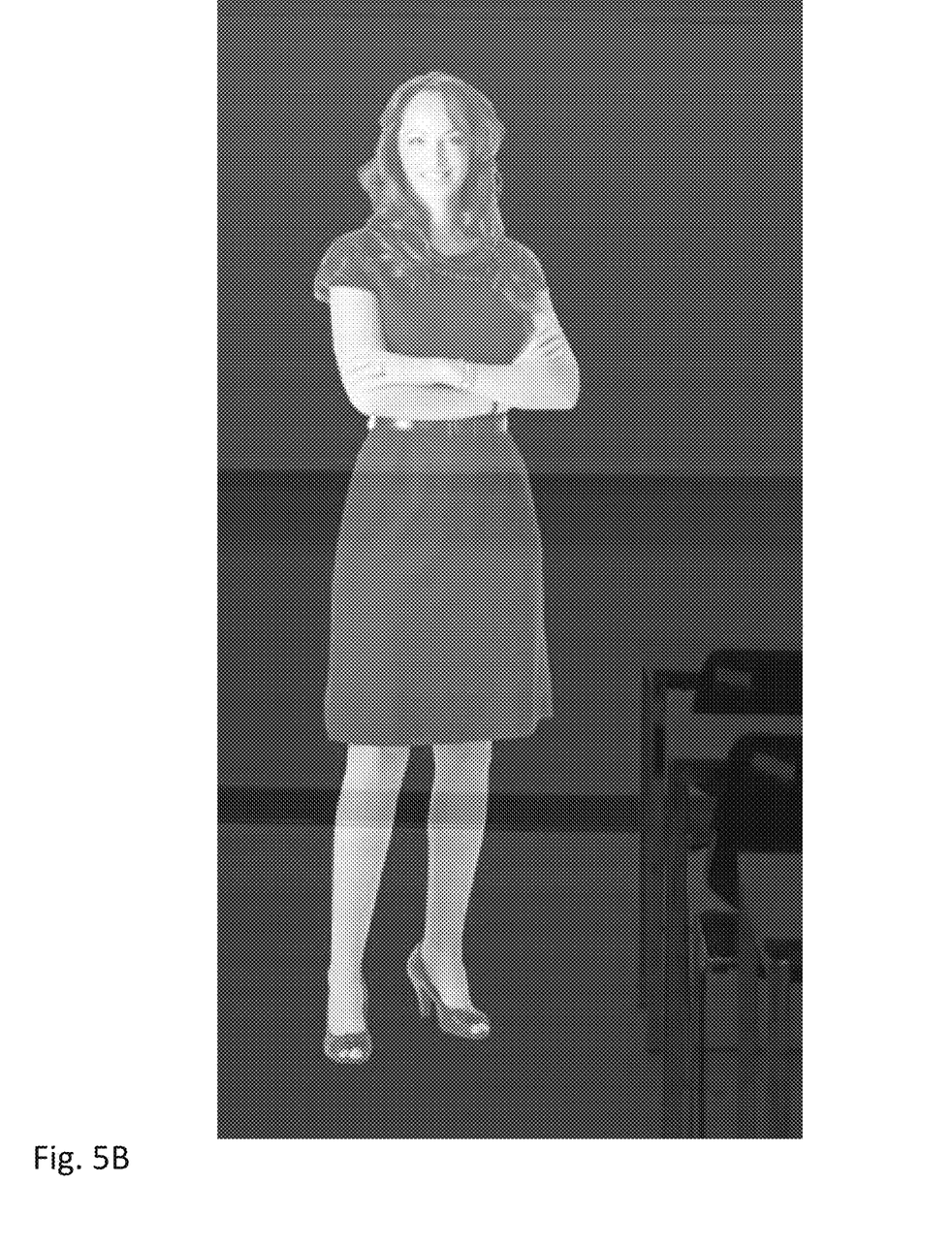
Figure 5C:
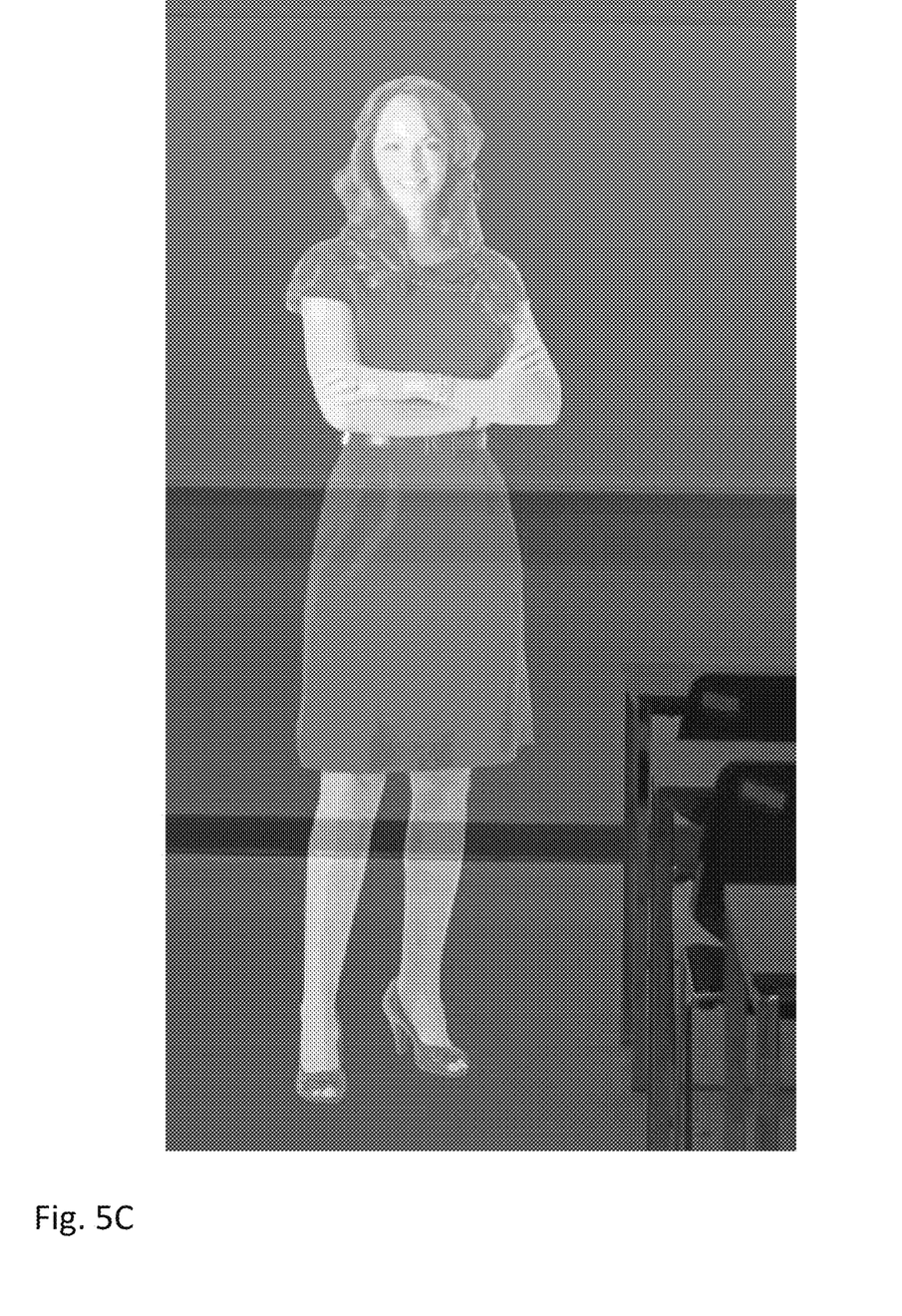

FIGS. 5A-5C illustrate adjusting a bit depth of the AR image based on a brightness level of the external scene. The AR image in these figures is an image of a woman wearing a dark dress. The AR image is overlaid over an external scene. The external scene shows a section of a classroom, including a yellow wall, a whiteboard on the yellow wall, a floor, and portions of three desks and two chairs. The differences between these figures is the following. In FIG. 5A, the AR image is rendered with a bit depth of eight, i.e., 256 possible intensity levels and the background scene has a certain brightness level. FIG. 5B is the same as FIG. 5A, except that the dimmer layer in the contact lens is made less transparent so that the background scene is less bright. The average gray level intensity is reduced by a factor of two from FIG. 5A to FIG. 5B, but FIG. 5B still uses a bit depth of eight for the AR image. FIG. 5C is the same as FIG. 5A, except that the bit depth of the AR image is reduce to three, i.e., only 8 possible intensity levels.

Comparing FIGS. 5A and 5B, the AR image appears more transparent in FIG. 5A because the brightness levels of the AR image and external background are more similar. In FIG. 5B, the AR image is more prominent and less transparent. The user has a better view of the AR image and, as a result, more details (including a higher bit depth) can be distinguished. In FIG. 5A, the background brightness is somewhat comparable to the AR image and washes out some of the detail and contrast of the AR image. As a result, the full bit depth of 8 bits is not easily distinguishable.

FIG. 5C shows the user's view where the AR image has a bit depth of three. The user's view shown in FIG. 5C is comparable to the user's view shown in FIG. 5A. However, because the bit depth of the image data is dropped from eight to three, only three bits of data need be transmitted to the eye-mounted display and power and bandwidth can be saved.

In some instances, different pixels in the image data are defined using different bit depths. The controller 340 may reduce a bit depth of some of the pixels, as opposed to all the pixels. For example, the controller 340 reduces a bit depth of pixels corresponding to a portion of the AR image overlaid with a bright portion of the external scene (e.g, the whiteboard) but not reduce a bit depth of pixels corresponding to another portion of the AR image overlaid with a dark portion of the external scene (e.g., the floor). Reducing the bit depth of the image data can have benefits, including saving power and saving bandwidth for transferring the image data.

The dimmer layer, brightness of the AR image and bit depth of the AR image can be controlled to achieve different purposes. One purpose may be to render the AR image with maximum detail and opacity. In that case, a dimmer background and brighter, higher bit-depth AR image are generally desired. Another purpose may be to render the AR image with some transparency, in which case a less bright AR image, possibly also requiring a lower bit depth, may be desired. Another purpose may be to reduce overall power consumption. In that case, the least bright and lowest bit depth AR image is desired. Dimming the background to the maximum extent possible will help to achieve this goal.

Figure 6:
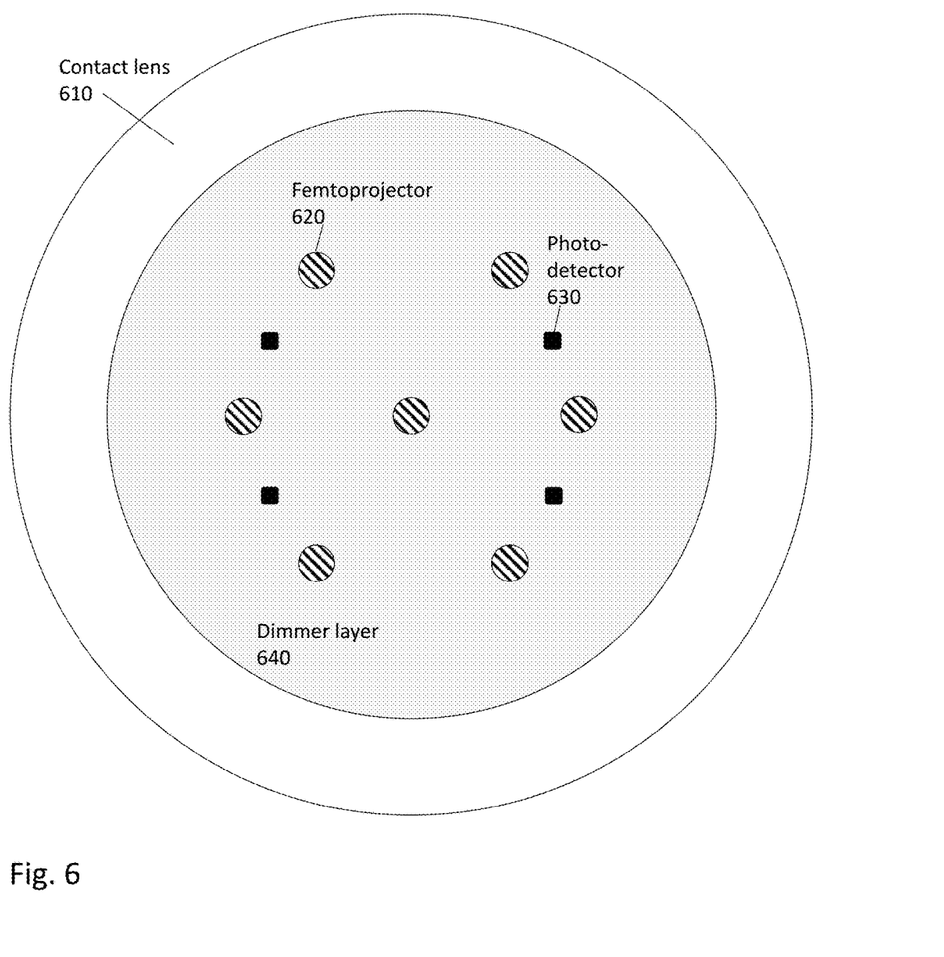
FIG. 6 is a schematic, plan view of a contact lens containing a plurality of femtoprojectors and a plurality of photodetectors.

Returning to FIG. 3, the eye-mounted display 300 in FIG. 3 includes one femtoprojector 320 and one photodetector 330. In other embodiments, an eye-mounted display may have more than one femtoprojector and/or more than one photodetector. FIG. 6 is a schematic, plan view of a contact lens 610 containing a plurality of femtoprojectors 620 and a plurality of photodetectors 630. The embodiment of FIG. 6 includes seven femtoprojectors 620 and four photodetectors 620. Other embodiments may include fewer or more femtoprojectors or photodetectors. FIG. 6 also shows a dimmer layer 640. No controller is shown in FIG. 6, but a controller may be placed anywhere in the contact lens 610 or external to the contact lens 610.

The femtoprojectors 620 project one or more AR images to a user's retina. An AR image is overlaid with at least a portion of an external scene. An example of each femtoprojector 620 is the femtoprojector 320 described in conjunction with FIG. 3. Different femtoprojectors 620 may be aimed at different regions of a user's retina and may project AR images at different spatial resolutions. Some of the femtoprojectors 620 may project static images and others may project video images.

In some designs, several femtoprojectors 620 may together project a single AR image. Different femtoprojectors project light to different portions of the retina. All the femtoprojectors in aggregate project light to portions of the retina that in aggregate span a certain field of view. The light from the femtoprojectors is projected onto the retina with pixel resolutions that are highest for pixels projected to a foveal section of the retina and lower for other sections (e.g., peripheral sections) of the retina.

The photodetectors 630 detect brightness levels of the external scene. An example photodetector 630 is the photodetector 330, 430 described in conjunction with FIGS. 3 and 4. Different photodetectors 630 may be oriented to different regions of the external scene and detect a brightness level for each of the different regions. Alternatively, each of the photodetectors 630 detects a brightness of a same region of the external scene or of the entire external scene. An average of the brightness levels detected by the photodetectors 630 is used as the brightness level for the controller.

In addition to the eye-mounted display, an overall system may also include other devices that implement functions not implemented in the contact lens. These other device may be worn by the user on a belt, armband, wrist piece, necklace, headpiece, or other types of packs.

Figure 7:
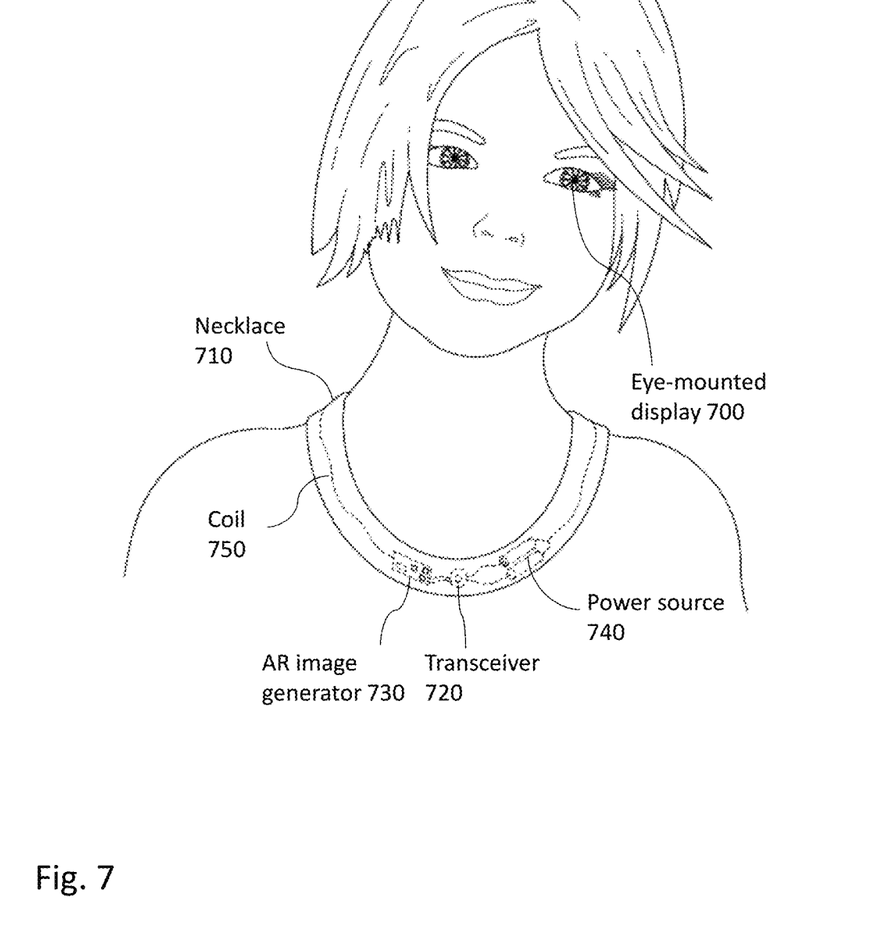
FIG. 7 shows a user wearing a necklace in communication with an eye-mounted device.

For example, FIG. 7 shows an implementation where, in addition to an eye-mounted display 700, the user is also wearing a necklace 710 that contains components communicating with an eye-mounted display 700. In this example, the necklace 710 includes a transceiver 720, an AR image source 730, a power source 740, and a coil 750. These components of the necklace 710 are shown with broken lines in FIG. 7 because they are placed inside the necklace and not visible from outside. These components can be located at other positions in the necklace 710 than their positions shown in FIG. 7.

The transceiver 720 facilitates communication between the necklace 710 with the eye-mounted display 700. An embodiment of the eye-mounted display 700 is the eye-mounted display 300 in FIG. 3. The transceiver 720 sends image data defining AR images from the AR image source 730 to the eye-mounted display 700. The transceiver 720 can also send signals indicating power availability from the power source 740 to the eye-mounted display 700. Similarly, the transceiver 720 can receive signals indicating power demand from the eye-mounted display 700 (e.g., a controller of the eye-mounted display 700) and dispatch the signals to the power source 740.

The AR image source 730 generates image data defining AR images to be projected by a femtoprojector of the eye-mounted display 700. The image data can define stationary images or videos. In some embodiments, the AR image source 730 is part of a controller 340 implemented on the necklace 710.

The power source 740 supplies power to the necklace 710 and the eye-mounted display 700. In some embodiments, the power source 740 sends, via the transceiver 720, signals indicating power availability (e.g., how much power is stored at the power source 740) to the eye-mounted display 700 and the eye-mounted display 700 can adjust a brightness level of an AR image projected to the user's eye based on the signals. For example, if power stored at the power source 740 is below a threshold amount, the power source 740 sends signals requesting a power save mode of the eye-mounted display 700. Under the power save mode, the eye-mounted display 700 projects the AR image at a minimum brightness level.

The power source 740 may also receive signals from the eye-mounted display 700 indicating a brightness level of an AR image projected to the user's eye based on the signals. The power source 740 determines how much power to supply to the eye-mounted display 700 based on the brightness level of the AR image. The coil 750 is a power coil that transfers power from the power source 740 to the eye-mounted display 700, e.g., by using a coil contained in a contact lens of the eye-mounted display 700.

The necklace 710 can include other components. For example, the controller 340 of FIG. 3 may be implemented in the necklace 710 instead. The controller can send the brightness level of the AR image to the eye-mounted display 700 via the transceiver 720, or can control the AR image source 730 to encode the adjusted brightness levels. The photodetector 330 of FIG. 3 may also be implemented in the necklace 710 instead. As another example, the necklace 710 includes an audio module to play audio signals to the user. The audio signals can be generated by the AR image source 730 or received from other sources.

Figure 8:
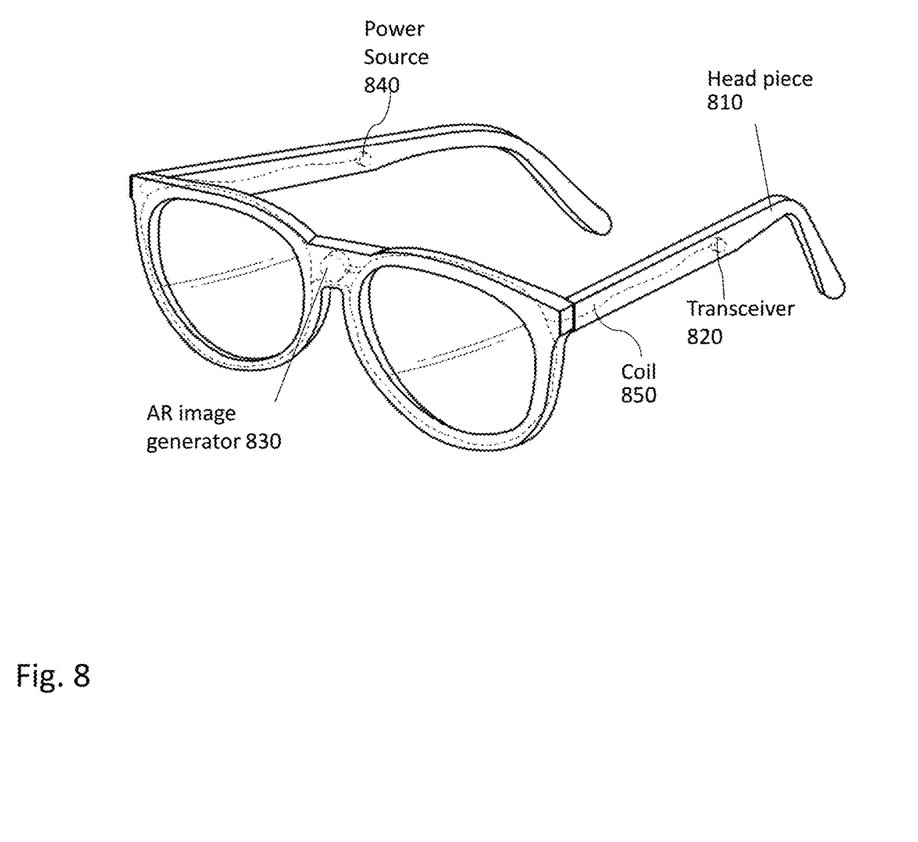
FIG. 8 shows a headpiece configured to communicate with an eye-mounted device.

FIG. 8 shows another implementation where a headpiece 810 contains components communicating with the eye-mounted display 700. The components contained in the headpiece 700 are similar to the components contained in the necklace 710 in FIG. 7. Because the headpiece 810 is closer to the eye-mounted display 700 when they are worn by the user, data transmission with the eye-mounted display 700 is faster and consumes less power.

In the example design of FIG. 8, the headpiece 810 is a pair of glasses. In other designs, the headpiece 810 can have other configurations. For example, the headpiece 810 could be a helmet or goggles.

The figures and the preceding description relate to preferred embodiments by way of illustration only. It should be noted that from the preceding discussion, alternative embodiments of the structures and methods disclosed herein will be readily recognized as viable alternatives that may be employed without departing from the principles of what is claimed.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

Alternate embodiments are implemented in computer hardware, firmware, software, and/or combinations thereof. Implementations can be implemented in a computer program product tangibly embodied in a machine-readable storage device for execution by a programmable processor; and method steps can be performed by a programmable processor executing a program of instructions to perform functions by operating on input data and generating output. Embodiments can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and other forms of hardware.

What is claimed is:

1. A system for controlling a brightness of an augmented reality eye-mounted display, the system comprising:
    an eye-mounted display comprising a contact lens containing a femtoprojector, the femtoprojector projecting an augmented reality image to a user's retina, the augmented reality image overlaid on an external scene viewed by the user through the contact lens, wherein the eye-mounted display receives image data defining the augmented reality image projected by the femtoprojector;
    a photodetector that detects a brightness level of the external scene; and a controller that adjusts a brightness level of the augmented reality image based on the brightness level of the external scene and adjusts a bit depth of the image data based on the brightness level of the augmented reality image.

2. The system of claim 1, wherein the photodetector and controller are also contained in the contact lens.

3. The system of claim 2, wherein the controller is implemented as analog electronics.

4. The system of claim 1, wherein the photodetector is outside the contact lens.

5. The system of claim 1, wherein the controller is outside the contact lens and wirelessly communicates the brightness level of the augmented reality image to the eye-mounted display.

6. The system of claim 1, wherein the photodetector is contained in the contact lens, the controller is outside the contact lens, and the brightness level of the external scene is wirelessly communicated to the controller.

7. The system of claim 1, wherein the photodetector detects the brightness level of a local sensing area within the external scene rather than an ambient brightness level of the entire external scene.

8. The system of claim 7, wherein the local sensing area includes a portion of the external scene over which the augmented reality image is overlaid.

9. The system of claim 7, wherein the photodetector is an image sensor.

10. The system of claim 1, wherein the controller adjusts the brightness level of the augmented reality image to achieve a transparency effect for the augmented reality image.

11. The system of claim 1, wherein, at the retina, the augmented reality image is at least two times brighter than a portion of the external scene over which the augmented reality image is overlaid.

12. The system of claim 1, wherein the controller adjusts the bit depth of the image data also based on the brightness level of the external scene.

13. The system of claim 1, wherein the image data includes a plurality of pixels and different pixels use different bit depths.

14. The system of claim 1, wherein the controller adjusts the bit depth of the image data in order to change power consumption of the eye-mounted display.

15. The system of claim 1, further comprising a dimmer layer positioned between the external scene and the retina, the controller adjusting a transparency of the dimmer layer, thereby adjusting brightness level of the external scene at the retina.

16. The system of claim 15, wherein the dimmer layer is contained in or on the contact lens.

17. The system of claim 15, wherein the controller adjusts transparency of the dimmer layer in order to change power consumption of the eye-mounted display.

18. The system of claim 1, wherein the contact lens contains a plurality of femtoprojectors that in aggregate project the augmented reality image to the user's retina.

19. A system for controlling a brightness of an augmented reality eye-mounted display, the system comprising:
an eye-mounted display comprising a contact lens containing a femtoprojector, the femtoprojector projecting an augmented reality image to a user's retina, the augmented reality image overlaid on an external scene viewed by the user through the contact lens;
a photodetector that detects a brightness level of a local sensing area within the external scene rather than an ambient brightness level of the entire external scene; and
a controller that adjusts a brightness level of the augmented reality image based on the brightness level of the external scene and wherein the controller can orient the photodetector to different local sensing areas within the external scene.

20. The system of claim 19, wherein the controller adjusts the brightness level of the augmented reality image to reduce power consumption of the eye-mounted display.

* * * * *